United States Patent [19]

Tomimatu

[11] Patent Number: 5,792,580
[45] Date of Patent: Aug. 11, 1998

[54] METHOD OF ALIGNING RETICLE PATTERN

[75] Inventor: Yoshikatu Tomimatu, Hyogo, Japan

[73] Assignee: Mitsubishi Denki Kabushiki Kaisha, Tokyo, Japan

[21] Appl. No.: 746,952

[22] Filed: Nov. 18, 1996

[30] Foreign Application Priority Data

Nov. 17, 1995 [JP] Japan .................................... 7-299820

[51] Int. Cl.$^6$ ......................................................... G03F 9/00
[52] U.S. Cl. ............................................. 430/22; 438/975
[58] Field of Search ................................ 430/22; 438/975

[56] References Cited

FOREIGN PATENT DOCUMENTS

| | | |
|---|---|---|
| 61-44429 | 3/1986 | Japan . |
| 62-84516 | 4/1987 | Japan . |
| 6-349705 | 12/1994 | Japan . |

*Primary Examiner*—Christopher G. Young
*Attorney, Agent, or Firm*—McDermott, Will & Emery

[57] ABSTRACT

Shot regions on a wafer are exposed and a first reticle pattern image is transferred thereon, and an LSA mark is formed in the center of each shot region of a chip positioned centrosymmetrically with respect to the center of the wafer. The wafer is prealigned, a rotation is corrected, and the position of the LSA mark is measured. The error parameter is produced by means of least squares method based on designed values and measured values to produce a new chip arrangement map, based on which the second and on reticle patterns are transferred by exposure. Thus, an offset correction fault with the rotation component of the reticle pattern is eliminated, thereby increasing throughput.

2 Claims, 6 Drawing Sheets

METHOD OF ALIGNING RETICLE PATTERN

BACKGROUND OF THE INVENTION

1. Field of the Invention

The present invention relates generally to alignment methods when a reticle pattern image is sequentially transferred onto each shot region on a wafer using an exposure device in the process of manufacturing a semiconductor device, and more particularity to an alignment method using an alignment mark.

2. Description of the Background Art

A device called stepper has been known as an exposure device used in the manufacture of semiconductor memory devices. The stepper reduces a pattern on a reticle (reticle pattern) with its projection lens while moving the wafer in a step wise manner under the projection lens and sequentially exposes each shot region on a single wafer with light and transfers the reticle pattern thereon.

The stepper has been devised in various ways to improve the precision of alignment. A conventional method of improving the alignment precision is disclosed by Japanese Patent Laying-Open No. 61-44429.

FIG. 5 is a flow chart schematically showing an exposure sequence according to an enhancement global alignment (EGA) method used in the conventional alignment method disclosed by Japanese Patent Laying-Open No. 61-44429.

Referring to FIG. 5, in step S401 (hereinafter "steps" will be omitted) each shot region on a wafer is exposed and the projected image of the first reticle pattern (reticle pattern image) is transferred thereon. This will be the top layer of a chip. In S403, an alignment mark (LSA mark) is formed at an end of a preselected shot region among all the shot regions with the transferred first reticle pattern image.

Then in S405, using an orientation flat (a linear portion of the contour of the wafer) the origin of the wafer is set (prealignment is conducted.) More specifically, the orientation flat is roughly positioned so as to be directed in a fixed direction on the wafer stage, placed on the wafer hold, and adhered with vacuum. Then in S407, using a wafer global alignment (WGA) mark (not shown) formed in each shot region, alignment for the entire wafer (global alignment) is conducted, in which the WGA marks are matched by referring to coordinate axes provided in the exposure device, and the wafer is turned for correction. Thus, a plurality of chips (shot regions) on the wafer are arranged in a matrix along the orthogonal coordinate axes.

In S409, the wafer stage having the wafer placed thereon is moved based on the arrangement coordinates (chip arrangement map) representing the arrangement of the chips as designed, and the position of an alignment mark (LSA mark) formed at an end of each of a plurality of shot regions predetermined for detecting errors is measured using a laser step alignment (LSA) optics. At the same time, the position of the wafer stage is measured by a offset interferometer. Based on the measured values, the deviation between the first reticle pattern image already transferred on the wafer and the chip arrangement map, in other words an error (offset) from the second and on reticle pattern images to be transferred. The deviation is obtained from the positional coordinates on the wafer stage corresponding to the detected error (offset) in alignment in each of the shot regions. In S411, the average of the deviations obtained in S409 is produced as a correction value (error parameter). In S413, based on the error parameter and the chip arrangement coordinates as designed, each shot region (first reticle pattern image) is corrected as for rotation, orthogonality, offset and scaling to produce a new chip arrangement map. In S415, according to the corrected new chip arrangement map, the wafer stage is moved in a step-and-repeat manner, and in S417, the second (second layer) and on reticle patterns are transferred by exposure.

As described above, the four correction values (error parameter) by offset correction, rotation correction, orthogonality correction, and scaling correction are used to produce a more precisely aligned pattern image.

An alignment method disclosed by Japanese Patent Laying-Open No. 6-349705 employs the above four correction values (error parameter) as well as additional six correction values for correcting offsets within the pattern image due to the distortion of the orthogonality of the chip resulting from the turning of the reticle pattern itself (chip rotation), linear expansion/contraction (chip scaling) and the distortion of the lens (distortion aberration),i.e., 10 correction values (error parameter) in total, and according to the method, the positions of four (a plurality of) LSA marks centrosymmetrically formed with respect to the center of a shot region are actually measured to obtain the offset between the positional coordinates and the arrangement coordinates as designed, and the result is subjected to an EOA operation to produce correction values (error parameter). The pattern image is aligned based on the result.

However, according to the alignment method disclosed by Japanese Patent Laying-Open No. 6-349705, a plurality of LSA marks are present in each shot region, and it takes much time to measure the positions of all those LSA marks, and therefore reduced throughput results.

FIG. 6 is a diagram showing how the error (offset) between the arrangement coordinates of the first reticle pattern image as designed and the actually measured positional coordinates is detected when an LSA mark AM is formed at an end of a shot region used according to the conventional alignment method disclosed by Japanese Patent Laying-Open No. 61-44429.

Referring to FIG. 6A, alignment mark AM is formed at an end of a shot region 501 of the first reticle pattern image.

Referring to FIG. 6B, it is for example assumed that the actually measured positional coordinates of the first reticle pattern image 503 is offset in the x-direction by k from the positional coordinates as designed and further includes a rotation amount of $\theta$.

The positional coordinates of LSA mark AM formed on shot region 503 of the first reticle pattern image if measured would be deviated by $\Delta x = (k + d\sin\theta)$ in the x-direction and by $\Delta y = (k + d\tan\theta) \times \sin\theta$ in the y-direction.

If the rotation error by the rotation of shot region 503 of the first reticle pattern image is corrected by means of offset correction of the wafer, the offset of shot region 505 in the second and on reticle pattern images with respect to the shot region of the first reticle pattern image in the third and fourth quadrants T1 will be small, but the offset in the first and second quadrants T2 opposite to the side with LSA mark AM will be greater than the offset in the third and fourth quadrants T1.

More specifically, the offset of the shot region of the first reticle pattern in the x-direction in the first and second quadrants T2 is $\Delta x = (k\cos\theta - d\sin\theta)$, while the offset correction value in the x-direction for the shot region of the second and on reticle pattern images is $(k\cos\theta + d\sin\theta)$, and their difference $(k\cos\theta - d\sin\theta) - (k\cos\theta + d\sin\theta) = -2 d\sin\theta$ apparently results from a correction fault with the rotation component of the first reticle pattern image.

Referring to FIG. 6C, it is for example assumed that all the shot regions of the first reticle pattern image are linearly expanded and particularly that the portion in the third and fourth quadrants has expanded in the -y-direction by the amount of b. The positional coordinates of LSA mark AM formed on the shot region 503 of the first reticle pattern image if measured would be offset in the y-direction by -b since LSA mark AM is present in the third and fourth quadrants T1 in this case.

The expansion of the pattern in the third and fourth quadrants T1 in the shot region 507 of the first reticle pattern is corrected by means of offset correction of the wafer, the offset of shot region 509 of the second and on reticle pattern images from the shot region 507 of the first reticle pattern image in the third and fourth quadrants T1 will be small, but the shot region 509 of the second and on reticle pattern images is offset from the shot region 507 of the first reticle pattern image in the first and second quadrants T2 this time.

More specifically, the correction value -b in the y-direction for the shot region 509 of the second and on reticle pattern images with respect to the shot region 509 of the first reticle pattern image in the first and second quadrants T2 directly becomes an error, and this is apparently because of a correction fault with contraction/expansion component in the y-direction of the pattern.

As described above, if the first reticle pattern image includes a rotation component or a contraction/expansion component, and the second and one reticle patterns are transferred by exposure based on the alignment mark formed at an end of a shot region, the shot region of the second and on reticle pattern images will be greatly offset from the shot region of the first reticle pattern image in the area opposite to the area with the alignment mark, and a correction fault results.

SUMMARY OF THE INVENTION

It is an object of the present invention to solve a correction fault with offset correction generated at the time of correcting the rotation or contraction/expansion of the first reticle pattern image, as well as improving throughput.

According to an alignment method of the present invention, a plurality of reticle patterns are sequentially transferred onto each of a plurality of shot regions on a wafer by exposure according to preset arrangement coordinates. The method includes the steps of transferring a projected image of a reticle pattern onto a plurality of shot regions by exposing each of the plurality of shot regions, forming an alignment mark in the centers of prescribed shot regions among the plurality of shot regions, detecting an error between the position of a point to be matched on the center of a shot region represented by preset arrangement coordinates and the position of the formed alignment mark, and correcting the preset arrangement coordinates based on the detected error.

More preferably, the prescribed shot regions are placed centrosymmetrically from each other with respect to the center of the wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, an alignment method according to preferred embodiments of the invention will be detailed in conjunction with the accompanying drawings.

Figure 1:
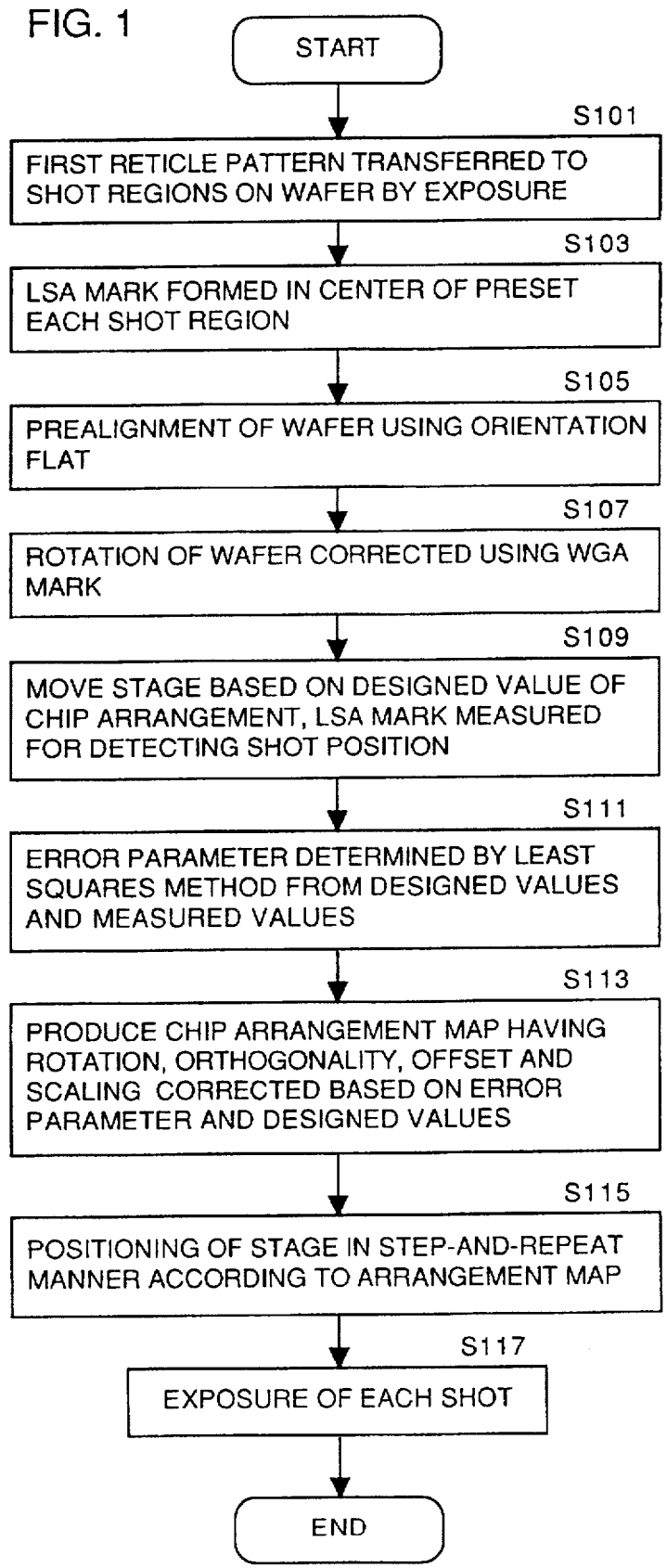
FIG. 1 is a flow chart showing an example of operation according to an alignment method of an embodiment of the invention.

FIG. 1 is a flow chart for use in illustration of operation in an alignment method according to an embodiment of the invention.

Referring to FIG. 1, the first reticle pattern is transferred onto each shot region on a wafer by exposure in S101 to form a projected image (reticle pattern image). Then in S103 a laser step alignment mark (LSA mark) is formed in the center of each of a preset number of (10, for example) shot regions arranged centrosymmetrically with respect to the center of the wafer among all the shot regions.

Figure 2:
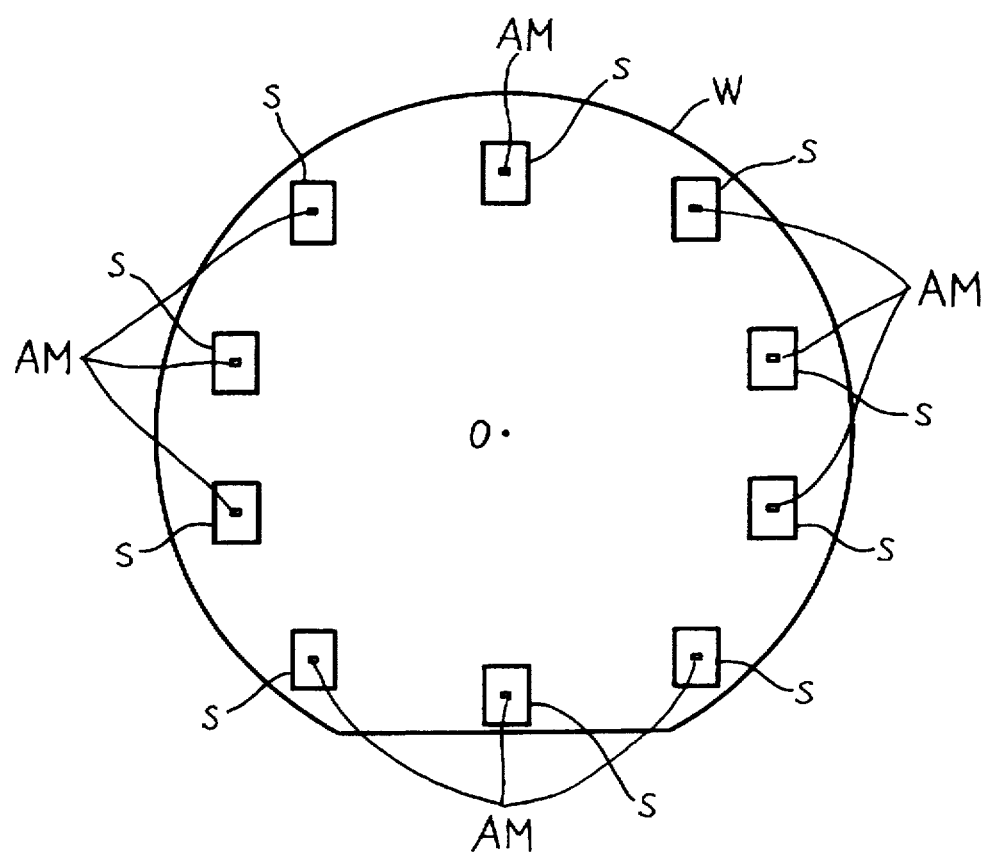
FIG. 2 is a diagram showing the arrangement of shot regions with an LSA mark on a wafer in S103 in FIG. 1 by way of illustration.

FIG. 2 is a diagram showing the arrangement on the wafer of the shot regions with the LSA mark formed in S103 in FIG. 1.

Referring to FIG. 2, shot regions s each having an LSA mark AM are positioned centrosymmetrically with respect to the center O of wafer W.

Figure 5:
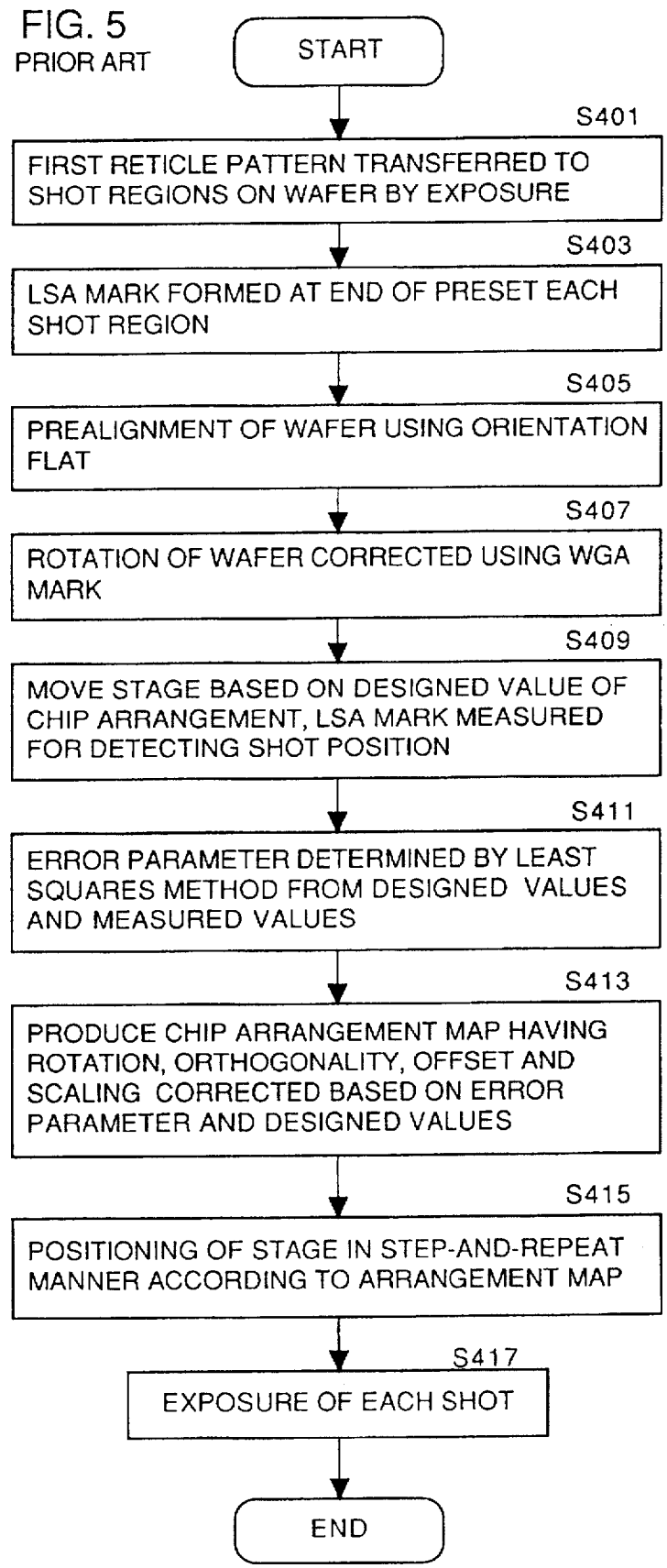
FIG. 5 is a flow chart for use in illustration of operation according to a conventional alignment method.

From S105, as is the conventional alignment method shown in FIG. 5, according to the operation based on enhancement global alignment (EGA) method, the error (offset) between the arrangement coordinates of the LSA mark as designed and the positional coordinates of the actually measured LSA mark is produced, and the shot regions of the first reticle pattern image and the shot regions of the second and on reticle pattern images are aligned.

More specifically, in S105, using the orientation flat, the wafer is prealigned, and the wafer is subjected to a rotation correction using the WGA mark. Then in S109 the wafer stage is moved based on the arrangement coordinates of the chip as designed (ship arrangement map), and the positional coordinates of the LSA mark are measured by an LSA optics. In S111, the deviation of the actually measured values with respect to the designed values (chip arrangement mark) is produced with respect to the positional coordinates of LSA marks, and error parameter for correcting the rotation of the wafer, the linear expansion/contraction of the wafer (wafer scaling), the orthogonality of the wafer and offsets are determined by least squares method.

In S113, the chip arrangement map is corrected using the error parameter determined in S111 to produce a new chip arrangement map. In S115, according to the new chip arrangement map produced in S113, the wafer stage is moved in a step-and-repeat manner, in S117 the second and on reticle patterns are transferred onto each shot region by means of exposure, and reticle pattern images are thus sequentially placed on the first reticle pattern image.

FIG. 3 is a diagram showing how the error (offset) between the arrangement coordinates of a reticle pattern image as designed and actually measured positional coordinates is detected when an LSA mark AM is formed in the center of a shot region used in alignment method according to an embodiment of the invention.

Figure 3A:
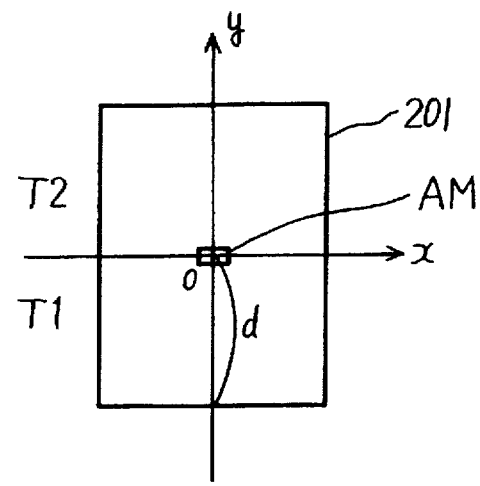
FIGS. 3A to 3C are diagrams showing how the error (offset) between the arrangement coordinates of the first reticle pattern image as designed and the actually measured positional coordinates is detected when an LSA mark AM is formed in the center of a shot region in an alignment method according to an embodiment of the invention.

Referring to FIG. 3A, alignment mark AM is formed in the center of a shot region 201 of the first reticle pattern image.

Figure 3B:
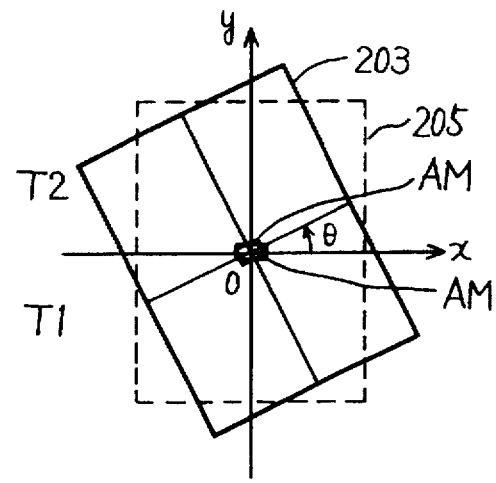

Referring to FIG. 3B, it is assumed that the positional coordinates of a shot region 203 of the first reticle pattern resulting from exposure and actually measured are rotated by θ around the center O of the shot region with respect to the arrangement coordinates as designed. As for the positional coordinates of LSA mark AM formed in the center O of the shot region, considering the center O of the shot region as origin, the actually measured positional coordinates (x', y')=(0, 0) is equal to the arrangement coordinates as designed (x, y)=(0, 0), and their deviation is represented as $\Delta x = x' - X = 0$, $\Delta y = y' - y = 0$ using $\Delta x$ and $\Delta y$.

Therefore, since there is no offset generated between the actually measured positional coordinates of LSA mark AM formed on the shot region 203 of the first reticle pattern and the arrangement coordinates as designed, therefore, the shot region 203 of the first reticle pattern image is regarded as shot as designed, and the shot region 205 of the second and on reticle pattern images will be sequentially aligned on the shot region of the first reticle pattern image for exposure.

Figure 6A:
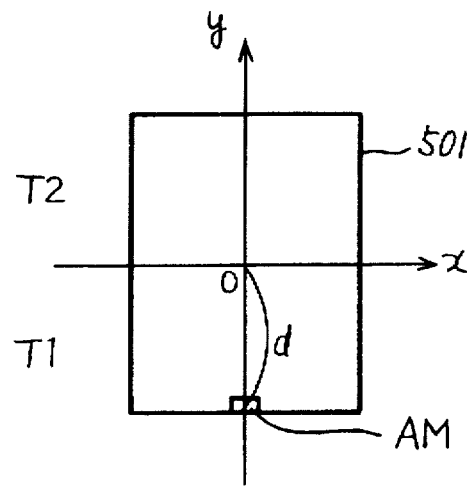
FIGS. 6A, 6B and 6C are diagrams showing how the offset between the positional coordinates of the first reticle pattern image as designed and the actually measured positional coordinates is detected when an LSA mark AM is formed at an end of a shot region used in a conventional alignment method.
Figure 6B:
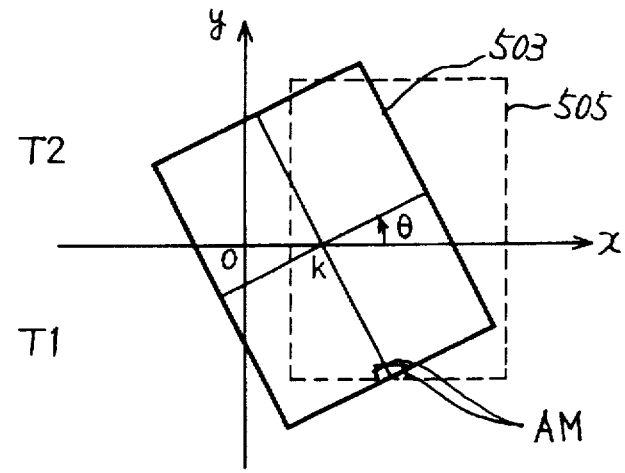

As a result, the deviation between the second and on reticle pattern images and the first reticle pattern image with a rotation component is distributed in an averaged manner between the third and forth quadrants T1 and the first and second quadrants T2, and the influence of the deviation will not locally appear on one side of the shot region even after correction, as opposed to the conventional example shown in FIG. 6B. More specifically, the rotation component of the reticle pattern image itself does not affect the error parameter for offset correction, and a correction fault with the rotation component of the first reticle pattern image itself due to offset correction is eliminated.

Figure 3C:
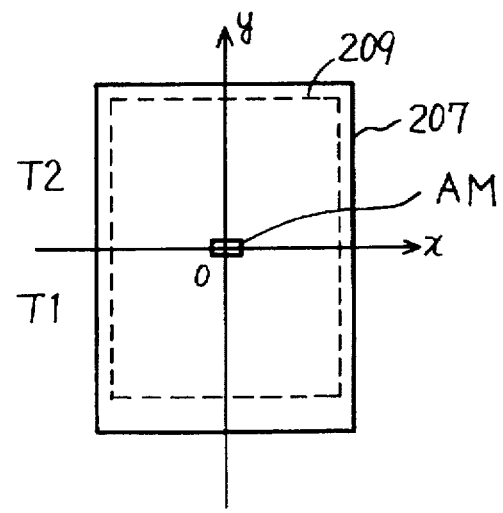

Referring to FIG. 3C, assume that the first reticle pattern image as a whole is linearly expanded, and particularly the portion in the third and fourth quadrants T1 has expanded by b in the −y-direction. Herein, since the central portion of shot region 207 of the first reticle pattern image has not contacted/expanded, the positional coordinates of LSA mark AM if measured (x', y')=(0, 0) are equal to the arrangement coordinates (x, y)=(0, 0) as designed.

Therefore, since there is no deviation between the actually measured positional coordinates of the LSA mark formed on the shot region 207 of the first reticle pattern image and the arrangement coordinates as designed, the first reticle pattern image is regarded as being shot as designed, and therefore the second and on reticle pattern images are sequentially aligned on the first reticle pattern image for exposure according to the arrangement coordinates as designed.

Figure 6C:
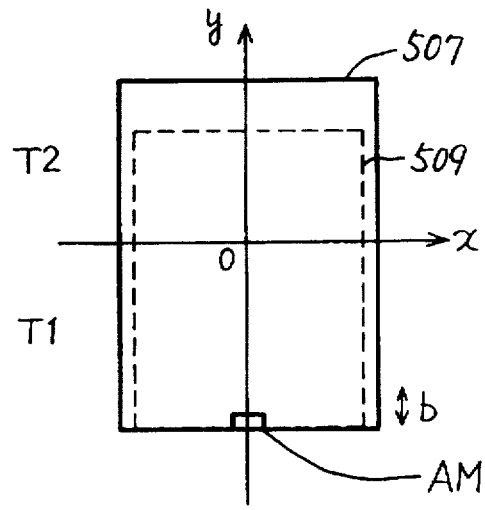

As a result, the offset between the second and on reticle pattern images and the first reticle pattern image having a contraction/expansion component will be smaller even after correction, as opposed to the conventional example shown in FIG. 6C. More specifically, the expansion/contraction component of the first reticle pattern image itself does not affect the error parameter for offset correction, and a correction fault with the expansion/contraction component of the first reticle pattern image itself due to offset correction as encountered in the conventional example is eliminated.

Today, an exposure device has better performance than before, the rotation or expansion/contraction of a reticle pattern image itself results in only a slight error in the order of several nm by installing a yawing interferometer at the wafer stage, for example, thereby correcting the magnifications of lens, reticle and process in a software manner. Other than using such a yawing interferometer, the expansion of a reticle pattern image (shot region) can be estimated based on the expansion of the wafer.

Figure 4:
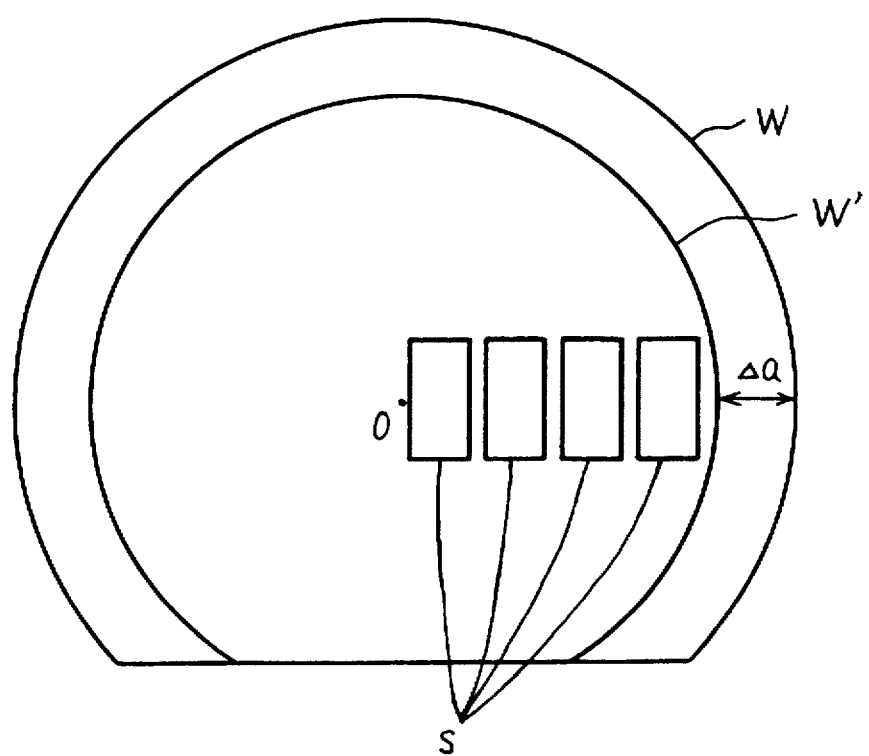
FIG. 4 is a diagram showing a method of estimating the contraction/expansion of a wafer to be used in an alignment method according to an embodiment of the invention.

FIG. 4 is a diagram showing a method of estimating the expansion/contraction of a wafer used in an alignment method according to an embodiment of the invention.

Referring to FIG. 4, assume that four chips (shot regions) s are placed on a wafer in the x-direction from the center O of the wafer. Now, assume that the wafer W expands in the x-direction by $\Delta a$ with respect to the center O of the wafer and wafer W' results. For the expansion $\Delta b$ in the x-direction of one chip (shot region), expansion $\Delta b$ in the X-direction of the chip (shot region) may be produced using approximation $\Delta a \approx 4 \times \Delta b$, provided that the intervals between chips (shot regions) s are narrow enough to ignore. More specifically, since $\Delta a$ represents the scaling amount of the wafer, $\Delta b$ may be produced by the enhancement global alignment (EGA) operation (detailed in Japanese Patent Laying-Open No. 6-349705).

Furthermore, the rotation of the first reticle pattern may be eliminated using a reticle interferometer (laser interferometer provided on the side of reticle).

Therefore, the rotation or expansion/contraction of the reticle pattern shown in FIG. 3 is restricted to a value as small as possible by the function of an exposure device as described above in practice, pattern alignment may be conducted with sufficient precision for use in photolithography in the process of manufacturing LSIs, if LSAs are formed in the centers of shot regions according to the alignment method of the present invention.

As for throughput, if there are four LSA marks in a shot region as disclosed by Japanese Patent Laying-Open No. 6-349705, time required for measuring the position of a single LSA mark is about 50 minutes, therefore, time required for throughput amounts to 50 (min)×4 (marks)=200 (min) in total plus other operation time such as transfer of the stage, exposure time (depending upon the number of patterns) which amounts to about 50 minutes, and therefore about 250 minutes in total will be necessary.

According to the present invention, however, if there is only one LSA mark on the first reticle pattern image in each shot region, time required for throughput is produced by adding about 50 minutes for measuring the position of the mark with about 50 minutes for the other operations as described above, and therefore it amounts to a shorter time period of about 100 minutes.

As described above, the alignment method according to the present invention eliminates a correction fault with offset correction for offsets generated from the rotation or expansion/contraction of a reticle pattern image, and time required for throughput may be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An alignment method used for sequentially transferring a plurality of reticle patterns onto each of a plurality of shot regions on a wafer according to preset arrangement coordinates, comprising steps of:

exposing each of said plurality of shot regions and transferring a projected image of a first reticle pattern onto each of said plurality of shot regions;

forming only one alignment mark in the center of each of a plurality of prescribed shot regions of said plurality of shot regions;

detecting an error between a position to be matched with the center of said shot region represented in said preset arrangement coordinates and the position of said formed alignment mark on said shot region; and correcting said preset arrangement coordinates based on said detected error.

2. The alignment method as recited in claim 1, wherein said prescribed shot regions are centrosymmetrically placed with respect to each other with respect to the center of said wafer.

* * * * *